(12) United States Patent
Jung et al.

(10) Patent No.: US 6,528,893 B2
(45) Date of Patent: *Mar. 4, 2003

(54) LOW-PIN-COUNT CHIP PACKAGE AND MANUFACTURING METHOD THEREOF

(75) Inventors: Kyujin Jung, Kyunggi-do (KR); Kun-A Kang, Seoul (KR)

(73) Assignee: Advanced Semiconductor Engineering, Inc. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/875,267

(22) Filed: Jun. 7, 2001

(65) Prior Publication Data

US 2001/0049156 A1 Dec. 6, 2001

Related U.S. Application Data

(62) Division of application No. 09/492,819, filed on Jan. 28, 2000, now Pat. No. 6,261,864.

(51) Int. Cl.[7] .............................................. H01L 23/28
(52) U.S. Cl. ...................................... 257/787; 257/678
(58) Field of Search ................................ 257/678, 692, 257/693, 734, 784, 787, 791

(56) References Cited

U.S. PATENT DOCUMENTS

| | | | |
|---|---|---|---|
| 5,474,066 A | 12/1995 | Grolman | 128/645 |
| 6,001,671 A | 12/1999 | Fjelstad | 438/112 |
| 6,093,584 A | 7/2000 | Fjelstad | 438/127 |
| 6,102,710 A | 8/2000 | Beilin et al. | 439/67 |
| 6,136,681 A | 10/2000 | Razon et al. | 438/617 |
| 6,261,864 B1 * | 7/2001 | Jung et al. | 438/105 |
| 6,342,730 B1 * | 1/2002 | Jung et al. | 257/692 |

OTHER PUBLICATIONS

R.O.C. Publication No. 348306, dated Nov. 7, 1985, entitled Device Having Resin Package And Method Of Producing The Same (English Abstract)

* cited by examiner

Primary Examiner—David Nelms
Assistant Examiner—David Nhu

(57) ABSTRACT

A low-pin-count chip package including a die pad for receiving a semiconductor chip and a plurality of connection pads electrically coupled to the semiconductor chip. The semiconductor chip, the die pad, and the connection pads are encapsulated in a package body such that the lower surfaces of the die pad and the connection pads are exposed through the package body. The present invention is characterized in that the die pad and the connection pads are formed by etching such that they have a concave profile and a thickness far larger than that of conventional die pad and connection pads formed by plating. This prolongs the path and time for moisture diffusion into the package, and significantly increases the area of the interface between the package body and the die pad as well as the connection pads thereby promoting adhesion therebetween. The present invention further provides a method of producing the low-pin-count chip package described above.

10 Claims, 5 Drawing Sheets

LOW-PIN-COUNT CHIP PACKAGE AND MANUFACTURING METHOD THEREOF

This application is a divisional of application Ser. No. 09/492,819 filed Jan. 28, 2000 now U.S. Pat. No. 6,261,864.

BACKGROUND OF THE INVENTION

1. Field of the Invention

This invention relates to semiconductor chip packages, and more specifically to low-pin-count chip packages and manufacturing methods thereof.

2. Description of the Related Art

FIG. 1 is a low-pin-count chip package 100 according to a preferred embodiment disclosed in R. O. C. Publication No. 348306 entitled "Device Having Resin Package And Method Of Producing The Same". The low-pin-count chip package 100 includes a chip 110 sealed in a package body 120. The active surface of the chip 110 is provided with a plurality of bonding pads 110a electrically connected to a plurality of connection pads 130. The backside surface of the chip 110 is exposed from the package body 120 through a conductive adhesive layer 112. The connection pads 130 are located at the periphery of the chip 110 and exposed from the lower surface of the package body 120 for making external electrical connection.

R. O. C. Publication No. 348306 entitled "Device Having Resin Package And Method Of Producing The Same" also discloses a method for making the low-pin-count chip package 100. The method mainly utilizes a metal frame 170 (see FIG. 2) to fabricate a plurality of the low-pin-count chip packages 100 simultaneously. The method comprises the steps of: (A) applying a photoresist layer over one surface of the metal frame 170, pattern transferring, and developing in a manner that areas on the metal frame 170 at which it is desired to form the connection pads 130 are not covered by the photoresist layer; (B) plating a layer of metal such as gold or palladium on the areas on the metal frame 170 without protection by the photoresist layer; (C) stripping the remaining photoresist; (D) attaching the backside surface of the semiconductor chip 110 onto the metal frame 170 through an adhesive layer wherein the active surface of the semiconductor chip is provided with a plurality of bonding pads 110a; (E) electrically coupling the bonding pads 110a on the semiconductor chip 110 to the corresponding connection pads 130; (F) forming a package body over the semiconductor chip 110. Finally, a separation step is performed to remove the metal frame 170. As shown in FIG. 2, the separation step typically comprises selectively etching the metal frame 170 with the connection pads 130 remaining intact by an etching agent.

Since the package body 120 does not cover the exposed lower surface of the connection pads 130, it can not firmly lock the connection pads 130. Adhesion depends on the overall nature of the interface region. A method for promoting adhesion is increasing the area of the interface between the package body 120 and the connection pads 130. However, since the connection pads 130 are formed by plating, the thickness thereof is limited (is proportional to the time for plating). Typically, thickness of the metal plating is only about 0.4 to 10.8 mils, which contributes quite little to the adhesion between the package body 120 and the connection pads 130.

Moreover, the connection pads 130 are made of metal with good electrical conductivity such as copper but the package body 120 is made of insulating material such as epoxy molding compound. Accordingly, the bond between connection pads 130 and the package body 120 is relatively weak and the difference of the coefficient of thermal expansion (CTE) therebetween is very large. Because of the CTE mismatch, stresses are induced at the interface between the connection pads and the plastic package body as the conventional package experiences temperature cycling. The stresses, in turn, result in the delamination at the metal-plastic interface. When the delaminations had occurred at the plastic-metal interface, moistures from the environment are easy to penetrate into the plastic package body and accumulate in the delaminated area. Once moisture accumulates in the package, rapid temperature ramp-up will cause the moisture to vaporize and expand, thereby inducing an hygrothermal stresses in the delaminated area which causes the surrounding plastic package body to popcorn. One of the most common occurrence of package popcorning occurs when the package described above is surface-mounted to a printed wiring board during the Infra-Red reflowing process.

Therefore, there is a need for methods of making the low-pin-count chip package that allow a significant increase of the thickness of connection pads thereby increasing the area of the interface between the package body and the connection pads. Thus, by promoting the adhesion between the package body and the connection pads, the present invention provides such a method overcoming or at least reducing the problems as described above.

SUMMARY OF THE INVENTION

The present invention therefore provides a low-pin-count chip package comprising a plurality of connection pads electrically connected to a semiconductor chip wherein the connection pads are formed by etching such that they have a concave profile and a thickness that allows good adhesion to the package body.

Accordingly, in a first aspect, the present invention provides a low-pin-count chip package including a die pad for receiving a semiconductor chip and a plurality of connection pads electrically coupled to the semiconductor chip. A package body is formed over the semiconductor chip and the connection pads in a manner that the lower surfaces of the die pad and the connection pads are exposed through the package body. The present invention is characterized in that the die pad and the connection pads are formed by etching such that they have a concave profile and a thickness far larger than that of conventional die pad and connection pads formed by plating. This significantly increases the area of the interface between the package body and the die pad as well as the connection pads, and prolongs the path and time for moisture diffusion into the package thereby enhancing the "locking" of the die pad and the connection pads in the package body as well as promoting adhesion therebetween.

According to a second aspect, this invention further provides a method of producing a low-pin-count chip package. The method comprises the steps of: (A) providing a sheet carrier having a metal layer on one surface thereof; (B) applying a photoresist layer on the metal layer of the carrier sheet; (C) photoimaging and developing the photoresist layer so as to expose predetermined portions of the metal layer, (D) forming a metal coating on the exposed portions of the metal layer; (E) stripping the remaining photoresist; (F) etching areas on the metal layer without protection of the metal coating so as to form a die pad and a plurality of connection pads having a concave profile; (G) attaching a semiconductor chip onto the die pad; (H) electrically coupling the semiconductor chip to the connection pads; (I)

forming a package body over the semiconductor chip and the connection pads; (J) removing the sheet carrier; and (K) forming a metal flash on the lower surface of the connection pads exposed from the package body.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
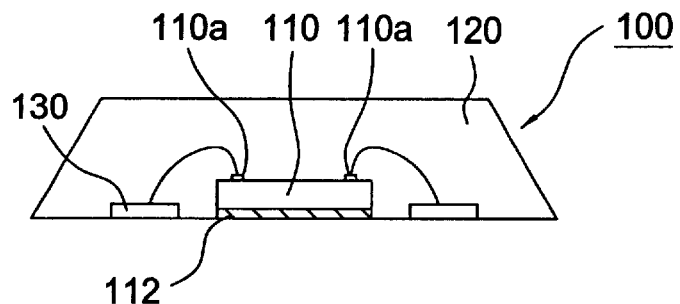
FIG. 1 is a cross-sectional view of a low-pin-count chip package according to a preferred embodiment disclosed in R. O. C. Publication No. 348306 entitled "Device Having Resin Package And Method Of Producing The Same"
Figure 2:
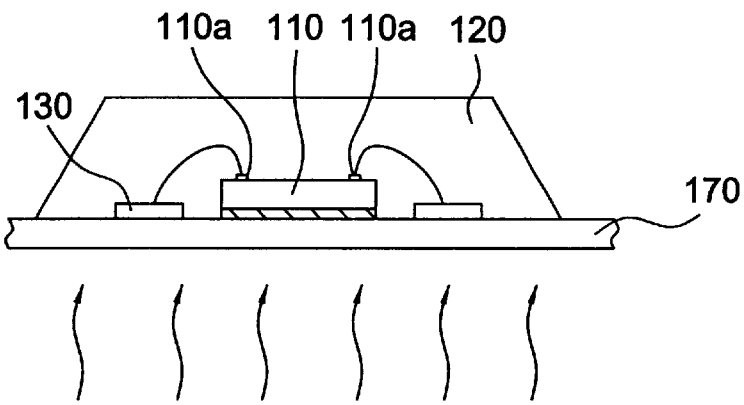
FIG. 2 illustrates the separation step of a method for making the low-pin-count chip package of FIG. 1 according to R. O. C. Publication No. 348306 entitled "Device Having Resin Package And Method Of Producing The Same"
Figure 3:
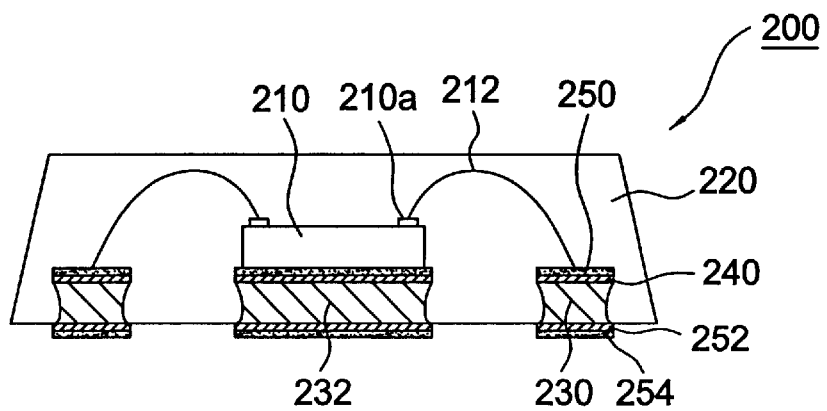
FIG. 3 is a cross-sectional view of a low-pin-count chip package according to a first embodiment of the present invention.

FIG. 3 discloses a low-pin-count chip package 200 in accordance with a first embodiment of the present invention comprising a chip 210 attached to a die pad 232 by either a conductive adhesive layer or nonconductive adhesive layer, e.g., epoxy (not shown). The active surface of the chip 210 is provided with a plurality of bonding pads 210a electrically connected to connection pads 230 through bonding wires 212. The connection pads 230 are arranged about the periphery of the die pad 232. A package body 220 is formed over the semiconductor chip and the connection pads. The connection pads 230 and the die pad 232 are exposed from the bottom of the package body 220. Both of them are far thicker than conventional die pad and connection pads formed by plating. The thickness of them are preferably 2–5 mils thereby increasing the area of the interface between the package body 220 and the die pad 232 as well as the connection pads 230, and prolonging the path and time for moisture diffusion into the package 200. As a result, the adhesion between the package body 220 and the die pad 232 as well as the connection pads 230 are significantly enhanced thereby enhancing the "locking" of the die pad 232 and the connection pads 230 in the package body 220. Of course, it could be inferred that the adhesion is proportional to the thickness of the die pad and the connection pads. Even the die pad and the connection pads have a thickness of 20 mils can be easily formed by the method described below in accordance with the present invention. However, the thickness of the die pad and the connection pads are preferably 2–5 mils in view of manufacturing cost and package size.

Preferably, the die pad 232 and the connection pads 230 are provided with a metal coating which allows a good bond to be formed with the bonding wires 212. The metal coating typically comprises a layer of nickel 240 covering the upper surfaces of the die pad 232 and the connection pads 230, and a layer of gold (or palladium) 250 covering the nickel layer 240. The lower surfaces of the die pad 232 and the connection pads 230 have a protective metal flash formed thereon. Preferably, the protective metal flash comprises a layer of nickel 252 covering the lower surfaces of the die pad 232 and the connection pads 230, and a layer of gold (or palladium) 254 covering the nickel layer. The protective metal flash prevents the die pad 232 and the connection pads 230 from corrosion or contamination.

The chip package 200 can be mounted onto a substrate, such as a printed circuit board (PC board), like other leadless devices. For example, a PC board is screen printed with a solder paste in a pattern which corresponds to the pattern of the connection pads 230 exposed from the bottom surface of the package 200. The package 200 is then appropriately positioned on the PC board and the solder is reflowed by using the conventional surface mount technology. Alternatively, the connection pads 230 exposed from the bottom surface of the package 200 can be printed with solder paste and then mounted onto a substrate.

FIGS. 4–10 show a method of making the low-pin-count chip package 200 according to a first embodiment of the present invention.

Figure 4:
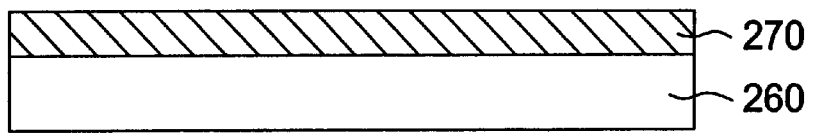
FIGS. 4–10 illustrate a method of making a low-pin-count chip package according to a first embodiment of the present invention.

FIG. 4 illustrates a sheet carrier 260 and a metal layer 270 such as a copper foil laminated thereon. Specifically, the sheet carrier 260 is preferably polyimide or polyester tape with a layer of silicone adhesive (not shown) formed thereon. The metal layer 270 is laminated on the sheet carrier 260 by conventional methods such as thermocompression. The purpose of the sheet carrier 260 is used to support the semiconductor chip 210 during the assembly process for producing the low-pin-count chip package 200.

Figure 5:
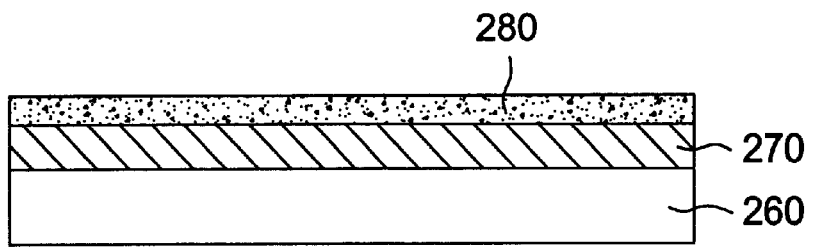

Referring to FIG. 5, a photoresist layer 280 is formed on the metal layer 270 by conventional techniques such as printing. The photoresist layer 280 is mainly composed of a resin mixture, and a photoactive material that makes the photoresist layer 280 photodefinable.

Figure 6:
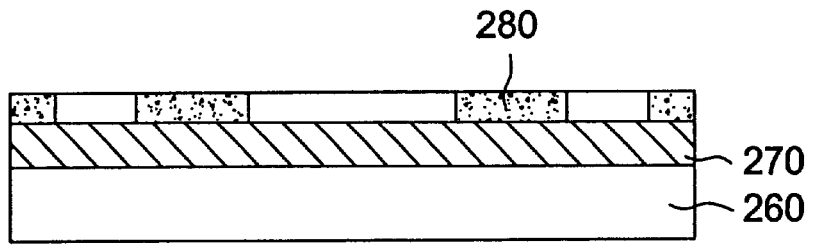

Referring to FIG. 6, the photoresist layer 280 is photo-imaged and developed. As is well-known, a photomask is used to image only certain area of the photoresist layer which, when developed, are removed to leave predetermined portions of the metal layer 270 exposed.

Figure 7:
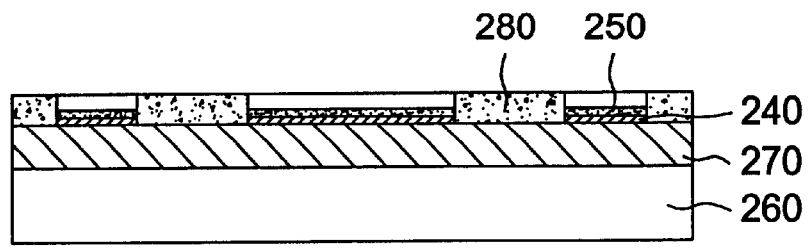

Referring to FIG. 7, the metal coating including a layer of nickel 240 and a layer of gold (or palladium) 250 are formed on the exposed portions of the metal layer 270 by using conventional plating techniques. Firstly, the nickel layer 240 is plated on the exposed portions of the metal layer 270 and then the gold (or palladium) layer 250 is plated on the nickel layer 240.

Figure 8:
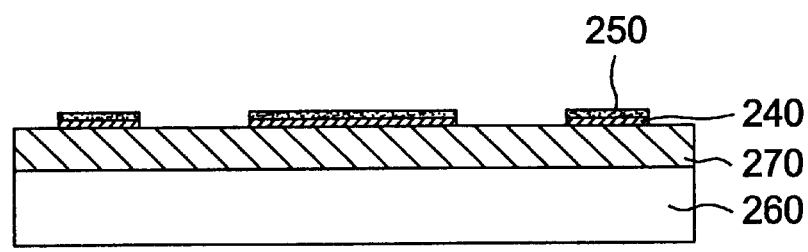

Referring to FIG. 8, the photoresist layer 280 is stripped by conventional methods.

Figure 9:
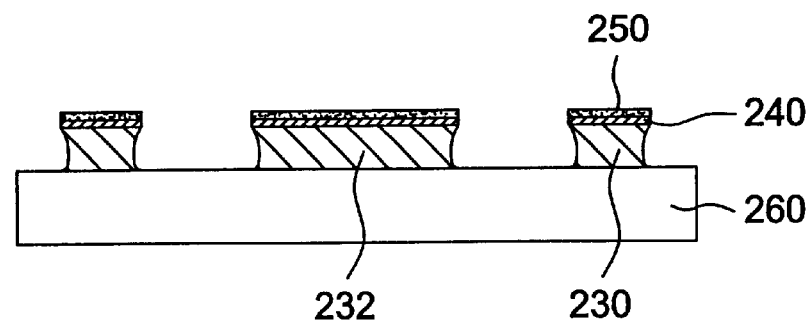

Referring to FIG. 9, the die pad 232 and the connection pads 230 are formed by etching areas on the metal layer 270 without protection of the metal coating (see FIG. 8). Therefore, the thickness of the die pad 232 and the connection pads 230 depends on the thickness of the metal layer 270 in this embodiment. Since, the etching time can be controlled in a desired range by adjusting the concentration of the etchant according to the thickness of the metal layer 270, the method of the present invention presents very little limitation on the design capability of the thickness of the die pad 232 and the connection pads 230. Moreover, since the metal coating is also formed on the connection pads 230 for electrical connecting to the chip 210, the metal coating should be formed of materials that allow a good bond to the conventional bonding wire.

Figure 10:
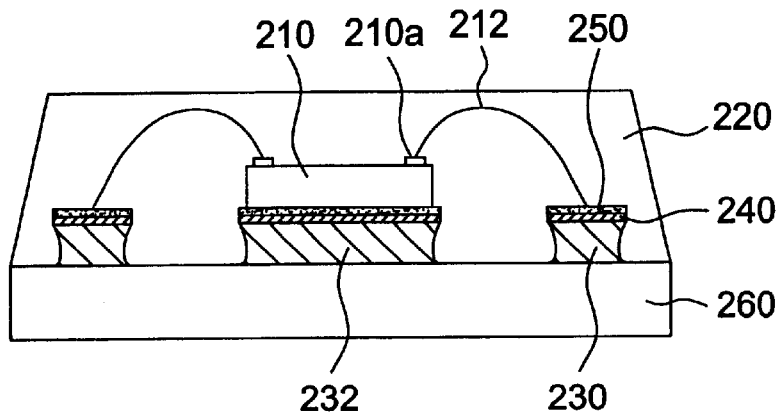

Referring to FIG. 10, the backside surface of the semiconductor chip 210 is securely attached onto the die pad 232 through an adhesive layer such as conductive/nonconductive epoxy (not shown). The bonding wires 212 are connected to the bonding pads 210a on the chip 210 and the connection pads 230 using known wire bonding techniques. Then, the package body 220 is formed over the sheet carrier 260, the connection pads 230 and the semiconductor chip 210 using known plastic molding methods such as transfer molding.

Finally, a separation process is performed to remove the sheet carrier 260 and then a protective metal flash is plated on the lower surfaces of the die pad 2321 and the connection pads 230 thereby the low-pin-count chip package 200 is obtained as shown in FIG. 3. Specifically, the separation process is accomplished by peeling off the sheet carrier 260 directly. After peeling, the die pad 232 and the connection pads 230 are still embedded in the package body 220.

Preferably, the protective metal flash comprises a layer of nickel 252 covering the exposed portions of the die pad 232 and the connection pads 230 through the package body 220, and a layer of gold (or palladium) 254 covering the nickel layer 252. The protective metal flash can help to prevent the exposed portions of the die pad 232 and the connection pads 230 from corrosion thereby assuring the heat dissipating as well, as the solder-joint reliability of the die pad 232 and connection pads 230.

Figure 11:
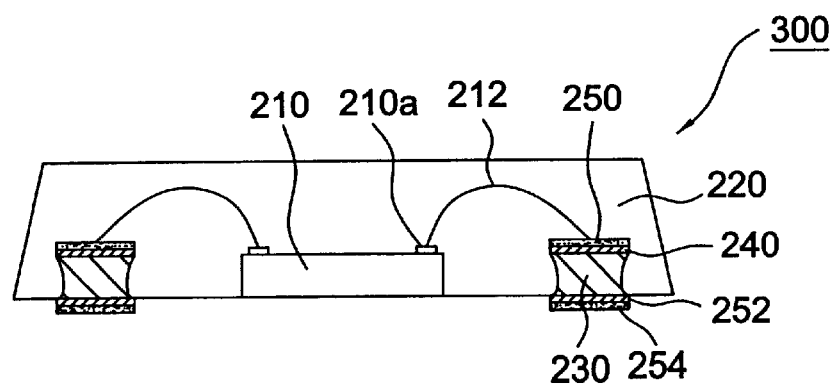
FIG. 11 is a cross-sectional view of a low-pin-count chip package according to a second embodiment of the present invention.

FIG. 11 discloses a low-pin-count chip package 300 in accordance with a second embodiment of the present invention comprising a chip 210 sealed in a package body 220. The chip package 300 is substantially identical to the package 200 of FIG. 3 with exception that the die pad 232 is skipped and the conductive/nonconductive adhesive layer (not shown) is directly exposed from the package body 220.

FIGS. 12–15 illustrate a method of making the low-pin-count chip package 300 according to a second embodiment of the present invention.

Figure 12:
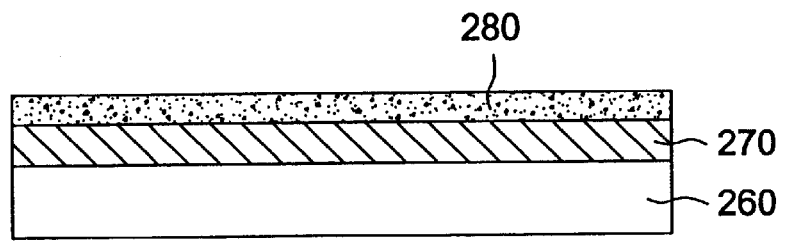
FIGS. 12–15 illustrate a method of making a low-pin-count chip package according to a second embodiment of the present invention.

Referring to FIG. 12, a photoresist layer 280 is applied onto the metal layer 270 laminated on the sheet carrier 260.

Figure 13:
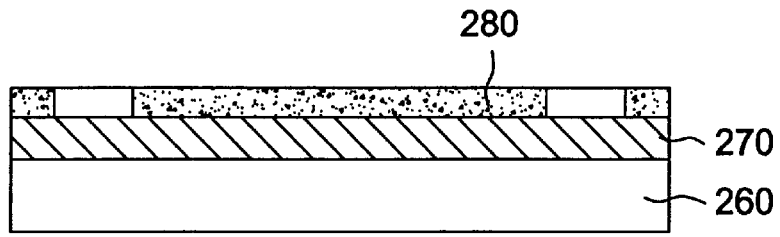

Referring to FIG. 13, the photoresist layer 280 is photo-imaged and developed such that predetermined portions of the metal layer 270 are exposed.

Figure 14:
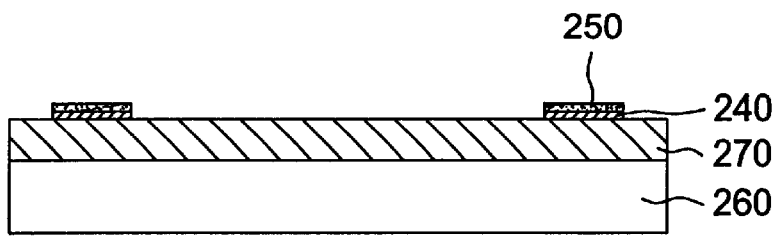

Referring to FIG. 14, the metal coating including a layer of nickel 240 and a layer of gold (or palladium) 250 are formed on the predetermined portions of the metal layer 270 (referring to FIG. 13), and then the photoresist layer 280 is stripped by conventional methods.

Figure 15:
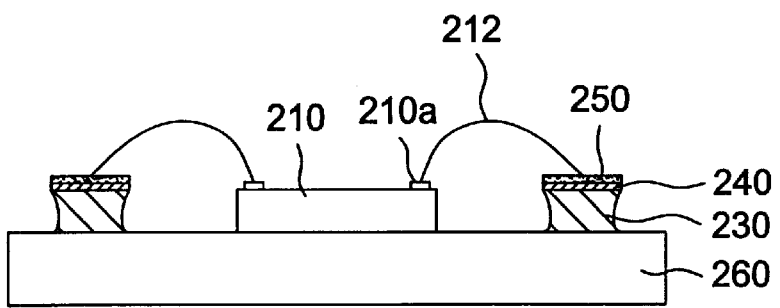

Referring to FIG. 15, the connection pads 230 are formed by etching areas on the metal layer 270 without protection of the metal coating (see FIG. 14) such that the connection pads 230 have a concave profile. Then, the semiconductor chip 210 is attached onto sheet carrier 260 through an adhesive layer (not shown) and the bonding wires 212 are connected to the bonding pads on the chip 210 and the connection pads 230 using known wire bonding techniques.

Finally, the package body 220 is formed over the connection pads 230 and the semiconductor chip 210. A separation process is performed to remove the sheet carrier 260, and then a protective metal flash is plated on the lower surfaces of the connection pads 230 thereby obtaining the low-pin-count chip package 300 as shown in FIG. 11.

According to the present invention, the die pad 232 as well as the connection pads 230 are formed by etching such that they have a concave profile, and a thickness (preferably 2–5 mils) far larger than that (typically 0.4–0.8 mils) of conventional die pad and connection pads formed by plating. This significantly increases the area of the interface between the package body 220 and the die pad 232 as well as the connection pads 220, and prolongs the path and time for moisture diffusion into the functional area of the package. As a result, the adhesion between the package body 220 and the die pad 232 as well as the connection pads 230 are significantly enhanced thereby enhancing the "locking" of the die pad 232 and the connection pads 230 in the package body 220.

Although the invention has been explained in relation to its preferred embodiment, it is to be understood that many other possible modifications and variations can be made without departing from the spirit and scope of the invention as hereinafter claimed.

What is claimed is:

1. low-pin-count chip package comprising:
   a semiconductor chip;
   a plurality of connection pads arranged about a periphery of the semiconductor chip wherein the connection pads have a concave profile;
   a metal coating on an upper surface of the connection pads;
   the semiconductor chip has a plurality of bonding pads electrically coupled to the connection pads;
   a package body formed over the semiconductor chip and the connection pads in a manner that a lower surface of the connection pads is exposed through the package body; and
   a metal flash on the lower surface of the connection pads exposed from the package body.

2. The low-pin-count chip package as claimed in claim 1, wherein the metal flash comprises a layer of nickel covering the lower surface of the connection pads, and a layer of metal selected from the group consisted of gold and palladium covering the nickel layer.

3. The low-pin-count chip package as claimed in claim 1, wherein the metal coating comprising a layer of nickel covering the upper surface of the connection pads, and a layer of metal selected from the group consisted of gold and palladium covering the nickel layer.

4. A low-pin-count chip package comprising:
   a die pad and a plurality of connection pads arranged about a periphery of the die pad wherein the die pad and the connection pads have a concave profile;
   a semiconductor chip disposed on the die pad;
   a metal coating on an upper surface of the die pad and the connection pads;
   the semiconductor chip has a plurality of bonding pads electrically coupled to the connection pads;
   a package body formed over the semiconductor chip and the connection pads in a manner that the lower surfaces of the die pad and the connection pads are exposed through the package body; and
   a metal flash on a lower surface of the die pad and the connection pads exposed from the package body.

5. The low-pin-count chip package as claimed in claim 4, wherein the metal flash comprises a layer of nickel covering the lower surface of the connection pads, and a layer of metal selected from the group consisted of gold and palladium covering the nickel layer.

6. The low-pin-count chip package as claimed in claim 4, wherein the metal coating comprising a layer of nickel covering the upper surface of the connection pads, and a layer of metal selected from the group consisted of gold and palladium covering the nickel layer.

7. The low-pin-count chip package as claimed in claim 1, wherein the connection pads have a thickness in the range of from about 2 mils to about 20 mils.

8. The low-pin-count chip package as claimed in claim 7, wherein the connection pads have a thickness in the range of from about 2 mils to about 5 mils.

9. The low-pin-count chip package as claimed in claim 4, wherein the connection pads and the die pad have a thickness in the range of from about 2 mils to about 20 mils.

10. The low-pin-count chip package as claimed in claim 9, wherein the connection pads and the die pad have a thickness in the range of from about 2 mils to about 5 mils.

* * * * *